Figure 1:
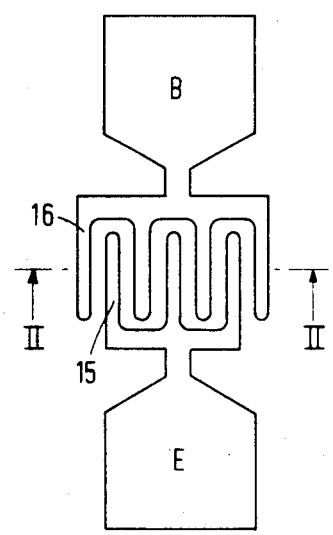

United States Patent [19]

Moors et al.

[11] Patent Number: 4,566,176

[45] Date of Patent: Jan. 28, 1986

[54] METHOD OF MANUFACTURING TRANSISTORS

[75] Inventors: Petrus M. A. W. Moors; Teunis H. Uittenbogaard, both of Nijmegen, Netherlands

[73] Assignee: U.S. Philips Corporation, New York, N.Y.

[21] Appl. No.: 612,987

[22] Filed: May 23, 1984

[51] Int. Cl.⁴ .......................................... H01L 21/265
[52] U.S. Cl. ...................... 29/578; 29/576 B; 29/590; 148/1.5; 148/DIG. 10
[58] Field of Search ............ 29/571, 578, 577 C, 29/590, 576 B; 148/1.5, DIG. 10, DIG. 11; 357/34, 43, 36; 156/661.1

[56] References Cited

U.S. PATENT DOCUMENTS

| | | | |
|---|---|---|---|
| 3,404,451 | 10/1968 | So | 29/578 |
| 3,783,046 | 1/1974 | Myers | 29/578 |
| 3,807,038 | 4/1974 | Watari et al. | 29/578 |
| 3,928,082 | 12/1975 | Schwettmann et al. | 148/1.5 |
| 3,943,546 | 3/1976 | Kaiser | 357/34 |
| 3,981,072 | 9/1976 | Buie | 29/578 |
| 4,111,720 | 9/1978 | Michel et al. | 29/578 |
| 4,151,541 | 4/1979 | Rogers | 357/36 |
| 4,175,317 | 11/1979 | Aoki et al. | 29/578 |
| 4,393,573 | 7/1983 | Kato et al. | 29/578 |
| 4,408,387 | 10/1983 | Kiriseko | 29/576 B |
| 4,456,488 | 6/1984 | Gahle | 29/576 B |

FOREIGN PATENT DOCUMENTS 6461   1/1979   Japan ............................ 29/578

OTHER PUBLICATIONS

Sze, *Physic of Semiconductor Devices* 1981, John Wiley & Sons, Inc., pp. 165-169.

*Primary Examiner*—Brian E. Hearn
*Assistant Examiner*—Hunter L. Auyang
*Attorney, Agent, or Firm*—Paul R. Miller

[57] ABSTRACT

A method of manufacturing a semiconductor device is set forth to provide a high-frequency bipolar transistor with very fine emitter-base geometry. The method comprises the steps of forming a base region, forming an insulating layer on the base region, and implanting emitter zones and base contact zones in windows in the insulating layer. Only emitter windows are first formed, then the emitter zones are implanted and a masking layer is provided on the insulating layer and in the emitter windows so that the base contact windows can be etched through apertures in the masking layer. The base contact zones are then implanted to the base contact windows.

5 Claims, 6 Drawing Figures

METHOD OF MANUFACTURING TRANSISTORS

The present invention relates to a method of manufacturing a semiconductor device with at least one bipolar transistor.

In U.S. Pat. No. 3,928,082 a method of manufacturing a bipolar transistor is described. According to that method first an oxide layer is provided on the surface of an n-type collector region. Then, in a first masking step, a window is etched in the oxide layer and in the window a p-type base region is formed by a doping process such as diffusion or ion implantation. Then a thin oxide layer is formed in the window, and in this oxide layer, in a second masking step, simultaneously emitter windows and base contact windows are etched. Subsequentely in a third masking step the base contact windows are blocked by a photoresist mask and donor ions are implanted in the emitter windows to form emitter regions. Then this photoresist mask is removed, and in a fourth masking step a further photoresist mask for blocking the emitter windows is provided, and acceptor ions are implanted in the base contact windows, after which the further photoresist mask is removed and emitter- and base electrodes are provided in the windows.

This known technique requires four masking steps prior to metallization. Of these four masking steps, the last two window-blocking steps are rather critical since the spacing between the windows is very small, especially in high-frequency transistors, and the width of the windows is also very small. This sets a limit to the dimensions of the emitter-base geometry.

In order to obtain transistors for operation at very high frequencies, well above 1 GHz such as required for instance in wide band amplifiers for satellite-TV receiving systems, the base-emitter finger pitch and emitter-finger width should be as small as possible (according to their shape the emitter- and base contact zones are often referred to as "fingers"; the spacing between their centerlines is referred to as "pitch"). For obtaining such extra fine geometries a minimum of masking steps, in particular of critical masking steps, is required.

The present invention provides an improved method in which only three masking steps are required, only one of which is critical with respect to this positioning relative to a former mask.

According to the invention a method of manufacturing a semiconductor device with a bipolar transistor comprises the steps of providing a first insulating layer on a surface of a collector region of a first conductivity type, forming at least one aperture in the first insulating layer, introducing a doping substance in the aperture to form at least one base region of the second, opposite conductivity type, forming a second insulating layer on the base region, forming at least one emitter window in the second insulating layer, implanting a doping substance in the emitter window to form at least one emitter region of the first conductivity type embedded in the base region, then providing a masking layer on the second insulating layer and in the emitter window, forming at least one opening in the masking layer above the base region and outside the emitter window, etching at least one base contact window in the second insulating layer under said opening, implanting a doping substance in the base contact window to form at least one base contact zone of the second conductivity type and higher doped than the base region, removing the masking layer and forming emitter contacts and base contacts in the emitter windows and base contact windows.

The method according to the invention requires only three masking steps prior to metallization, instead of the four masking steps of the known method described above. Furthermore only the last one of these three masking steps requires a precise positioning with respect to the emitter window, after which the etching of the base contact windows and the implantation of the base contact zones is carried out in a fully self-aligned manner. With this method a transistor with an extremely fine interdigitated electrode structure may be obtained, for instance with a 2.5 $\mu$m emitter-base finger pitch and 0.75 $\mu$m emitter-finger width. In combination with shallow base- and emitter regions and thin epitaxial layers $f_T$-values of more than 7 GHz may be obtained.

The invention will now be explained in detail with reference to the drawing in which FIG. 1 is a plan view of the emitter-base geometry of a transistor manufactured according to the invention and FIGS. 2-6 show diatrammatically in corsssection along the line II—II of FIG. 1 successive stadia in the manufacturing of a transistor according to the invention.

The Figures are diagrammatic and are not drawn to scale. In particular the dimensions in the thickness-direction are exaggerated. Corresponding parts have the same reference numerals, and semiconductor regions of the same conductivity type in crosssection are hatched in the same direction.

FIG. 1 shows in plan view the electrode geometry of emitter (E) and base (B) metallization of an example of a transistor manufactured according to the present invention. In this example only three emitter fingers and four base fingers are shown; normally the number of fingers is much greater although a transistor having only one emitter region and only one base contact zone may be made according to the invention.

To start with, there is provided a first insulating layer 1 on a surface of a collector region 2 of a first conductivity type. See FIG. 2 which, like FIGS. 3-6, is a crosssection according to the line II—II in FIG. 1. In this embodiment collector region 2 is an epitaxial n-type silicon layer having a thickness of 1.2 $\mu$m and a resistivity of 1.3 Ohm cm, grown on a substrate 3 of highly doped n-type silicon and having a resistivity of 0.012 Ohm cm. Other thicknesses and resistivities may be chosen if desired. Layer 1 in this example is a silicon-oxide layer with a thickness of for instance 0.6 $\mu$m.

Figure 2:
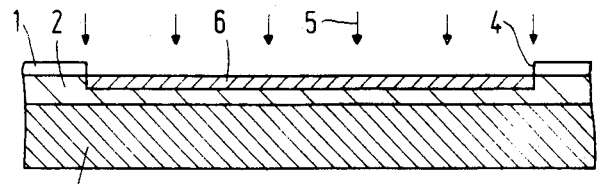

In oxide layer I in a first masking step at least one aperture 4 is formed, see FIG. 2. By means of implantation of $BF_2^{++}$ ions 5 (dose $7 \times 10^{13}$ ions per cm$^2$, energy 75 keV) and using oxide layer 1 as a mask a base region 6 of the second, opposite (in this example p) conductivity type is formed having a thickness of about 0.4 $\mu$m. Other doping substances than $BF_2^{++}$ ions may be used. If desired base region 6 may be formed by diffusion instead of by ion implantation. If desired a number of base regions may be formed and connected together.

Figure 3:
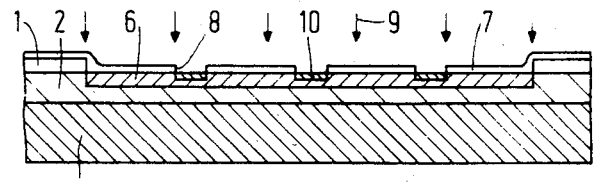
Figure 4:
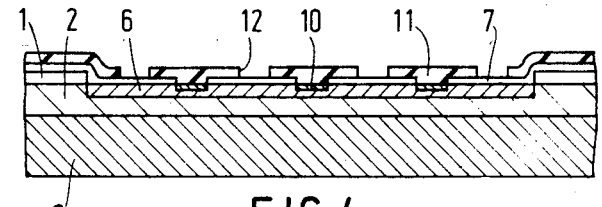

A second insulating layer 7, in this example also of silicon oxide and 0.3 $\mu$m thick is formed on base region 6 (and in this example also on oxide layer 1), see FIG. 3.

Layer 7 may be deposited by decomposition of a silicon compound such as SiH$_4$ or by other means; it may also be thermally grown. In oxide layer 7 in a second masking step at least one emitter window 8, in this example three windows, are formed by etching, such as photolithographic etching using a photoresist mask.

Then, donor ions, in this example, arsenic ions 9 (dose $5 \times 10^{15}$ ions per cm$^2$, energy 30 keV) are implanted in the emitter windows to form at least one (here three) n-type emitter regions 10 embedded in base region 6. The emitter regions 10 are about 0.2 μm thick.

A masking layer 11 (see FIG. 4) is then provided on the second insulating layer 7 and in the emitter windows, and in a third masking step at least one opening 12 (here four) is formed in masking layer 11 above base region 6 and outside the emitter windows 8. In this example layer 11 is a photoresist or other radiation-sensitive masking layer in which the openings 12 are provided by exposure to radiation and development in the usual way.

Figure 5:
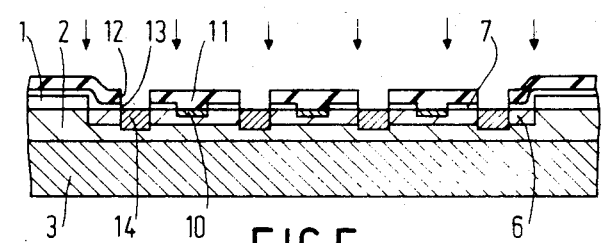
Figure 6:
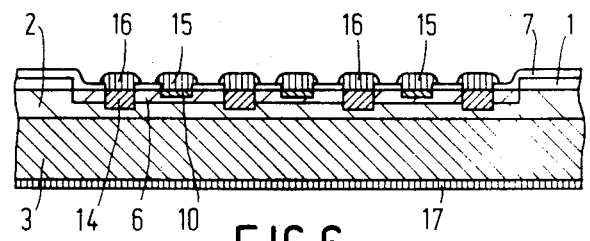

Using layer 11 as an etching mask, base contact windows 13 are now etched in oxide layer 7 under openings 12, see FIG. 5. Then, boron ions (dose $10^{15}$ ions per cm$^2$, energy 25 keV) are implanted in the base contact windows 13 to form at least one (here four) 0.6 μm deep p-type base contact zones 14 which are more heavily doped than base region 6. The base contact zones 14 may extend throughout the thickness of base region 6 but this is not necessary. This boron implantation is done using the photoresist layer 11 as a mask.

The photoresist mask 11 is then removed by stripping in the usual way, and an annealing at 1000° C. for 13 minutes is done. The abovementioned thicknesses of emitter-, base- and base contact zones all refer to the final thickness obtained after this annealing step. Emitter contacts 15 and base contacts 16 (see FIG. 6 and also FIG. 1) are formed in emitter and base contact windows 8 and 13. A collector electrode layer 17 may be formed on substrate 3 (see FIG. 6). The emitter- and base-metallization may be Ti-Pt-Au or any other suitable metal.

The transistor may then be mounted and encapsulated. In this example the base-emitter finger pitch is 2.5 μm and the emitter finger width is 0.75 μm. The transition frequency $f_T$ is 7.5 GHz. Due to the high $f_T$ value and the low base resistance the noise is very low. These features are clearly superior to those of transistors obtained with conventional techniques.

Although the transistor of the above example is a discrete device, the method according to the invention may be also used to manufacture a monolithic integrated circuit comprising a bipolar transistor. In this case the collector contact normally will be provided on the upper major surface.

The invention is not limited to the example described above. The emitter- and base contact regions do not ncessarily have the form of fingers but may also have other geometries. The insulating layer may consist of materials other than silicon oxide, for instance silicon nitride. There may be emitter series resistances incorporated in the emitter fingers. For passivation purposes on the insulating layers 1 and 7 there may be provided further insulating layers, for instance in the above example oxide layer 7 outside base region 6 may be covered with a silicon nitride layer. Finally the used photoresist may be sensitive to other radiations than visible light, for instance to ultraviolet radiation or to X-rays, and the conductivity types may be inverted so as to obtain an pnp- instead of an npn-transistor.

What is claimed is:

1. A method of manufacturing a high frequency bipolar transistor comprising the steps of providing a first insulating layer on a surface of a collector region of a first conductivity type, forming at least one aperture in said first insulating layer, introducing dopant of a second conductivity type into said surface through said aperture in said first insulating layer to form a base region of said second conductivity type, providing a second insulating layer at least on said base region, forming a plurality of windows in said second insulating layer, introducing dopant of said first conductivity type into said plurality of windows to form a plurality of emitter regions embedded into said base region, providing a masking layer onto said second insulating layer and said plurality of emitter regions, forming a second plurality of windows in said masking layer above said base region and exclusive of said emitter windows, etching said second insulating layer at said second plurality of windows in said masking layer, introducing dopant of said second conductivity type through said second plurality of windows to form a plurality of base contact zones in said base region, said base contact zones being more highly doped than said base region, removing said masking layer, and forming a plurality of emitter contacts contacting said plurality of emitter regions and a plurality of base contacts contacting said plurality of base contact zones through said first plurality of windows and said second plurality of windows respectively.

2. A method according to claim 1, wherein said plurality of emitter contacts and said plurality of base contacts are interdigitized.

3. A method according to claim 1, wherein said masking layer is a photoresist layer.

4. A method according to claim 1, wherein said first and second insulating layers are of silicon dioxide.

5. A method according to claim 1, wherein said high frequency bipolar transistor has a transition frequency of 7.5 GHz.

* * * * *